(12) United States Patent
Tsuma et al.

(10) Patent No.: US 12,426,329 B2
(45) Date of Patent: Sep. 23, 2025

(54) SILICON CARBIDE SEMICONDUCTOR DEVICE INCLUDING A SIDE SILICIDE LAYER AND METHOD FOR MANUFACTURING THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Hiroki Tsuma, Nisshin (JP); Yuji Nagumo, Nisshin (JP); Masashi Uecha, Nisshin (JP); Teruaki Kumazawa, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 512 days.

(21) Appl. No.: 17/981,049

(22) Filed: Nov. 4, 2022

(65) Prior Publication Data

US 2023/0154987 A1    May 18, 2023

(30) Foreign Application Priority Data

Nov. 12, 2021    (JP) ................... 2021-185005

(51) Int. Cl.
*H10D 62/832*    (2025.01)
*H01L 21/02*    (2006.01)
(Continued)

(52) U.S. Cl.
CPC ... *H10D 62/8325* (2025.01); *H01L 21/02008* (2013.01); *H01L 21/02447* (2013.01);
(Continued)

(58) Field of Classification Search
CPC ........ H10D 8/60; H10D 8/051; H10D 12/031; H10D 30/665; H10D 30/66; H10D 62/405;
(Continued)

(56) References Cited

U.S. PATENT DOCUMENTS

2014/0117505 A1*  5/2014  Mackh ................. H01L 23/562
                                                            257/620
2019/0259615 A1*  8/2019  Kawai ................. H10D 30/635
(Continued)

*Primary Examiner* — William B Partridge
*Assistant Examiner* — Chevy J Boegel
(74) *Attorney, Agent, or Firm* — Posz Law Group, PLC

(57) ABSTRACT

A silicon carbide semiconductor device includes a silicon carbide semiconductor layer and a side silicide layer. The silicon carbide semiconductor layer includes a silicon carbide single crystal and has a main surface, a rear surface opposite to the main surface, and a side surface connecting the main surface and the rear surface and formed by a cleavage plane. The silicon carbide semiconductor layer further includes a modified layer. The modified layer forms a part of the side surface located close to the rear surface and has an atomic arrangement structure of silicon carbide different from an atomic arrangement structure of the silicon carbide single crystal. The side silicide layer includes a metal silicide that is a compound of a metal element and silicon. The side silicide layer is disposed on the side surface of the silicon carbide semiconductor layer and is adjacent to the modified layer.

10 Claims, 14 Drawing Sheets

(51) Int. Cl.
*H01L 21/04*     (2006.01)
*H01L 21/78*     (2006.01)
*H10D 8/01*      (2025.01)
*H10D 8/60*      (2025.01)
*H10D 12/01*     (2025.01)
*H10D 30/66*     (2025.01)
*H10D 62/10*     (2025.01)
*H10D 62/40*     (2025.01)
*H10D 64/23*     (2025.01)
*H10D 64/62*     (2025.01)

(52) U.S. Cl.
CPC .. *H01L 21/02529* (2013.01); *H01L 21/02598* (2013.01); *H01L 21/78* (2013.01); *H10D 8/60* (2025.01); *H10D 12/031* (2025.01); *H10D 62/40* (2025.01); H01L 21/0485 (2013.01); H01L 2924/00 (2013.01); H01L 2924/0002 (2013.01); H10D 8/051 (2025.01); H10D 30/665 (2025.01); H10D 62/106 (2025.01); H10D 62/405 (2025.01); H10D 64/252 (2025.01); H10D 64/62 (2025.01)

(58) Field of Classification Search
CPC .. H10D 64/252; H01L 21/78; H01L 21/28518
See application file for complete search history.

(56) References Cited

U.S. PATENT DOCUMENTS

2021/0069926 A1* 3/2021 Fuji .................. B23K 26/364
2021/0234007 A1   7/2021 Ueno et al.

* cited by examiner

SILICON CARBIDE SEMICONDUCTOR DEVICE INCLUDING A SIDE SILICIDE LAYER AND METHOD FOR MANUFACTURING THE SAME

CROSS REFERENCE TO RELATED APPLICATION

The present application claims the benefit of priority from Japanese Patent Application No. 2021-185005 filed on Nov. 12, 2021. The entire disclosure of the above application is incorporated herein by reference.

TECHNICAL FIELD

The present disclosure relates to a silicon carbide (hereinafter referred to as "SiC") semiconductor device and a manufacturing method of a SiC semiconductor device.

BACKGROUND

Dicing methods for SiC wafers include a stealth dicing method. In the stealth dicing method, a modified layer is formed inside a SiC wafer by irradiating the SiC wafer with a laser beam along lines to be cut. When an external force is applied to the SiC wafer, cracks propagate from the modified layer in a thickness direction of the SiC wafer. Accordingly, the SiC wafer is divided into multiple chips.

SUMMARY

The present disclosure provides a SiC semiconductor device including a SiC semiconductor layer and a side silicide layer. The SiC semiconductor layer includes a SiC single crystal and has a main surface, a rear surface opposite to the main surface, and a side surface connecting the main surface and the rear surface and formed by a cleavage plane. The SiC semiconductor layer further includes a modified layer. The modified layer forms a part of the side surface located close to the rear surface and has an atomic arrangement structure of SiC different from an atomic arrangement structure of the SiC single crystal. The side silicide layer includes a metal silicide that is a compound of a metal element and silicon. The side silicide layer is disposed on the side surface of the SiC semiconductor layer and is adjacent to the modified layer.

The present disclosure also provides a manufacturing method of the SiC semiconductor device.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
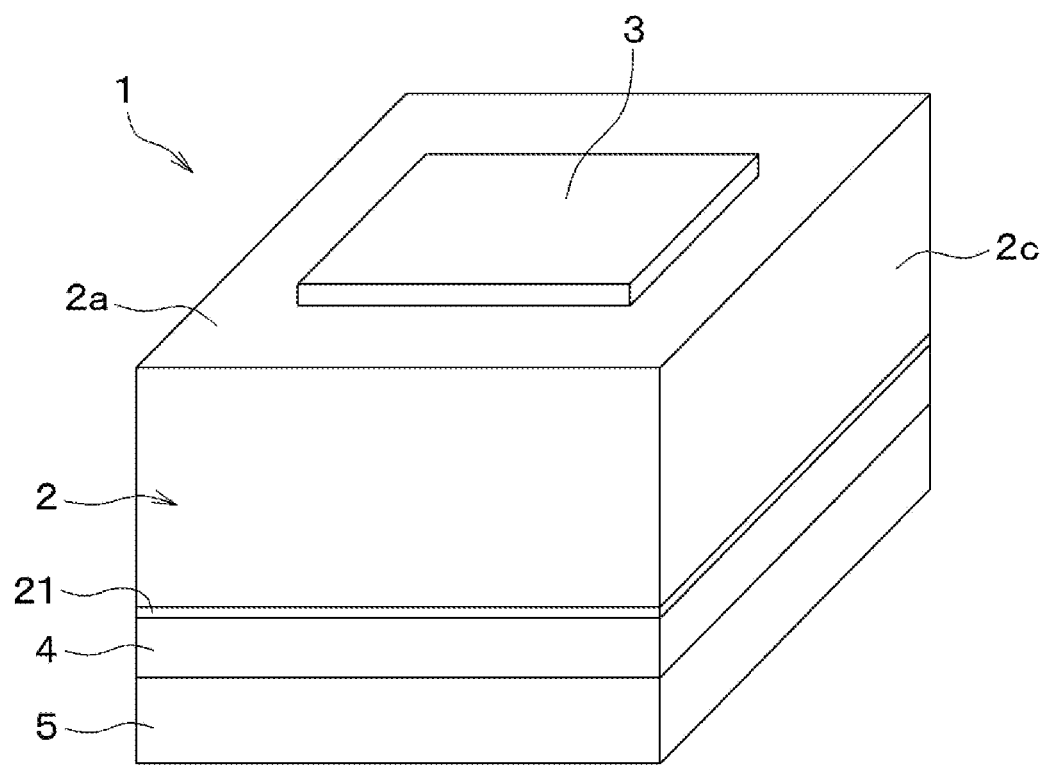
FIG. 1 is a perspective view of a SiC semiconductor device according to a first embodiment.

The present inventors have investigated to perform a scribe-and-break method as a method of dicing SiC wafers. In the scribe-and-break method, grooves are formed along dicing lines on a rear surface of a SiC wafer to form cracks. After that, an external force is applied to the SiC wafer so that the cracks propagate in the thickness direction of the SiC wafer. Accordingly, the SiC wafer is divided into multiple chips (that is, SiC semiconductor devices).

In this method, when the grooves are formed in the SiC wafer, a modified layer is generated around the grooves. After the SiC wafer is cut, the modified layer is exposed on a part of the side surface of the SiC semiconductor layer located close to the rear surface. That is, the modified layer forms a part of the side surface of the SiC semiconductor layer located close to the rear surface. The present inventors found that, in a device in which a SiC semiconductor device is mounted, when stress such as thermal stress is applied to the SiC semiconductor device, cracks occur in the modified layer on the side surface of the SiC semiconductor layer, and cracks propagate inside the SiC semiconductor layer.

A SiC semiconductor device according to a first aspect of the present disclosure includes a SiC semiconductor layer and a side silicide layer. The SiC semiconductor layer includes a SiC single crystal and has a main surface, a rear surface opposite to the main surface, and a side surface connecting the main surface and the rear surface and formed by a cleavage plane. The SiC semiconductor layer further includes a modified layer. The modified layer forms a part of the side surface located close to the rear surface and has an atomic arrangement structure of SiC different from an atomic arrangement structure of the SiC single crystal. The side silicide layer includes a metal silicide that is a compound of a metal element and silicon. The side silicide layer is disposed on the side surface of the silicon carbide semiconductor layer and covers the modified layer.

According to the first aspect, the side silicide layer covers the modified layer on the side surface of the SiC semiconductor layer. Therefore, when stress is applied to the SiC semiconductor device, stress applied to the modified layer is relaxed. Therefore, compared with a case where the SiC semiconductor device does not include the side silicide layer, it is possible to suppress the occurrence of cracks on the side surface of the SiC semiconductor layer.

A SiC semiconductor device according to a second aspect of the present disclosure includes a SiC semiconductor layer and a side silicide layer. The SiC semiconductor layer includes a portion made of a SiC single crystal and has a main surface, a rear surface opposite to the main surface, and a side surface connecting the main surface and the rear surface and formed by a cleavage plane. The SiC semiconductor layer further includes a modified layer. The modified layer forms a part of the side surface located close to the rear surface and has an atomic arrangement structure of SiC different from an atomic arrangement structure of the SiC single crystal. The side silicide layer includes a metal silicide that is a compound of a metal element and silicon. The side silicide layer is disposed on the side surface of the silicon carbide semiconductor layer and is adjacent to a side of the modified layer that is close to the rear surface. The side silicide layer faces and is in contact with the portion of the silicon carbide semiconductor layer made of the SiC single crystal in a direction parallel to the main surface.

According to the second aspect, since the side silicide layer is formed on the side surface of the SiC semiconductor layer, the modified layer present on the side surface of the SiC semiconductor layer is reduced compared to a case where the side silicide layer is not formed. As a result, it is possible to suppress the occurrence of cracks on the side surface of the SiC semiconductor layer as compared with the case where the side silicide layer is not provided.

A manufacturing method of a SiC semiconductor device according to a third aspect of the present disclosure includes: preparing a SiC wafer including a SiC semiconductor layer, the SiC semiconductor layer including a SiC single crystal and having a main surface and a rear surface opposite to the main surface; forming a groove on the rear surface of the SiC semiconductor layer along a line to be cut to generate a crack; forming a metal film on a wall surface that forms the groove; forming a silicide layer including a metal silicide on a portion of the SiC semiconductor layer close to the wall surface by reacting silicon contained in the SiC semiconductor layer with a metal element contained in the metal film by heat treatment; and applying stress to the SiC wafer to propagate the crack along a direction orthogonal to the main surface, and cutting the SiC wafer into multiple chips.

According to the above-described manufacturing method, the SiC semiconductor device according to the first aspect or the second aspect can be manufactured. Therefore, the same effects as those of the SiC semiconductor device according to the first aspect or the second aspect can be obtained.

Hereinafter, embodiments of the present disclosure will be described with reference to the drawings. In the following embodiments, the same or equivalent parts are denoted by the same reference numerals.

First Embodiment

[SiC Semiconductor Device]

Figure 2A:
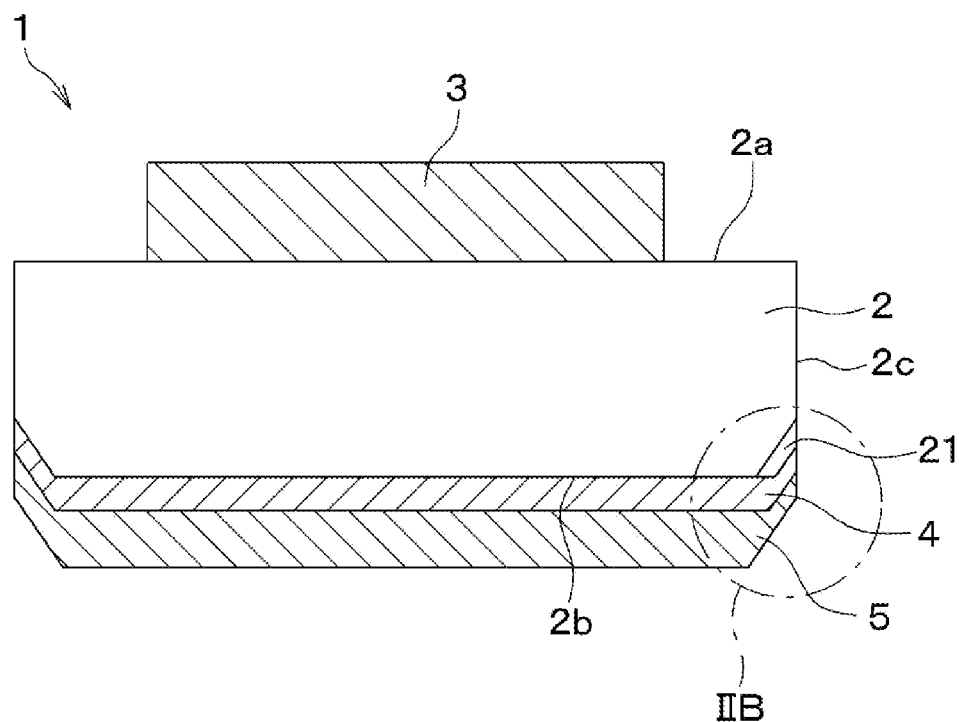
FIG. 2A is a cross-sectional view of the SiC semiconductor device according to the first embodiment.

As shown in FIG. 1 and FIG. 2A, a SiC semiconductor device 1 according to the present embodiment is one semiconductor chip formed by dividing a SiC wafer into multiple chips. The SiC semiconductor device 1 has the following basic configuration. The SiC semiconductor device 1 includes a SiC semiconductor layer 2, a front surface electrode 3, a silicide layer 4, and a rear surface electrode 5.

The SiC semiconductor layer 2 includes a SiC single crystal. The SiC semiconductor layer 2 has a main surface 2a, a rear surface 2b and multiple side surfaces 2c. The main surface 2a is a surface on which main components constituting an element are formed, and is called an element forming surface. The main surface 2a has a quadrangle shape. The rear surface 2b is a surface opposite to the main surface 2a. Each of the side surfaces 2c is a surface connecting the main surface 2a and the rear surface 2b. Each of the side surfaces 2c forms a part of the side surface of the SiC semiconductor device 1.

The SiC semiconductor layer 2 is mainly composed of 4H—SiC single crystal, which is a hexagonal SiC single crystal. The SiC semiconductor layer 2 may be mainly composed of 2H—SiC single crystal or 6H—SiC single crystal, which are hexagonal SiC single crystals.

The main surface 2a faces a c-plane of the SiC single crystal. The c-plane is the hexagonal (0001) plane. The main surface 2a has an off-angle inclined at an angle larger than 0° and smaller than or equal to 10° with respect to the c-plane of the SiC single crystal.

Figure 3:
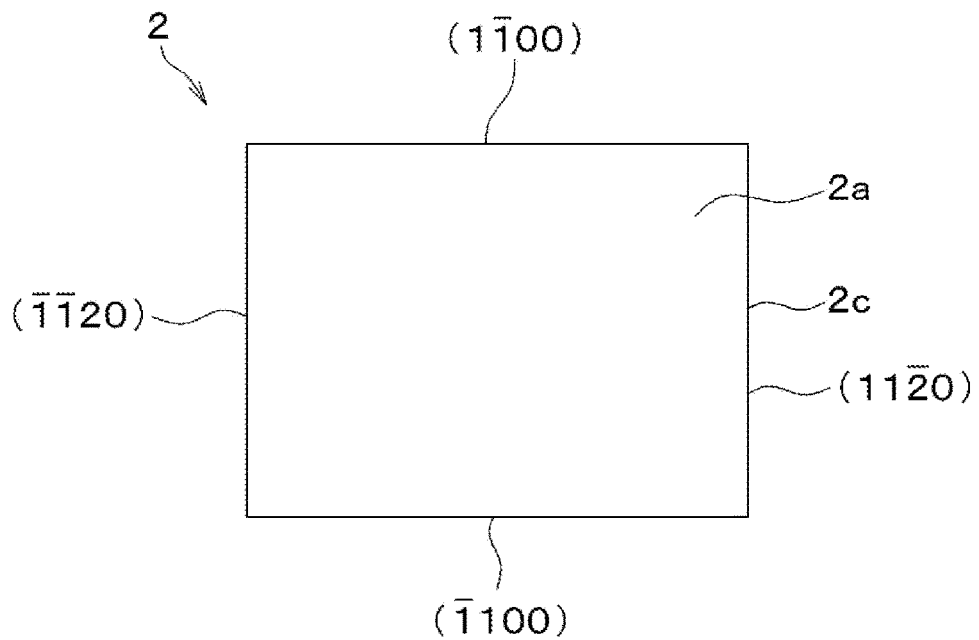
FIG. 3 is a top view of a SiC semiconductor layer included in the SiC semiconductor device according to the first embodiment.

Each of the side surfaces 2c is formed by a cleavage plane. The cleavage plane is a flat plane formed by cleavage and is a predetermined crystal orientation plane. As shown in FIG. 3, when the SiC semiconductor layer 2 is composed of the 4H—SiC single crystal, the predetermined crystal orientation planes are a (−1-120) plane, a (11-20) plane, a (−1100) plane, and a (1-100) plane. When indicating the crystal orientation, a bar (−) is originally attached above a desired number, but since there are restrictions on expression based on electronic filing, a bar is attached in front of the desired number in the present specification.

The SiC semiconductor layer 2 includes a modified layer 21. The modified layer 21 is formed by forming grooves 110 in a scribing process, which will be described later. The modified layer 21 has an atomic arrangement structure of SiC different from that of SiC single crystal. The atomic arrangement structure of SiC different from that of SiC single crystal includes polycrystalline and amorphous structure. The modified layer 21 forms a part of each of the side surfaces 2c located close to the rear surface 2b.

The front surface electrode 3 is formed on the main surface 2a of the SiC semiconductor layer 2. The front surface electrode 3 is composed of a conductive film.

Figure 2B:
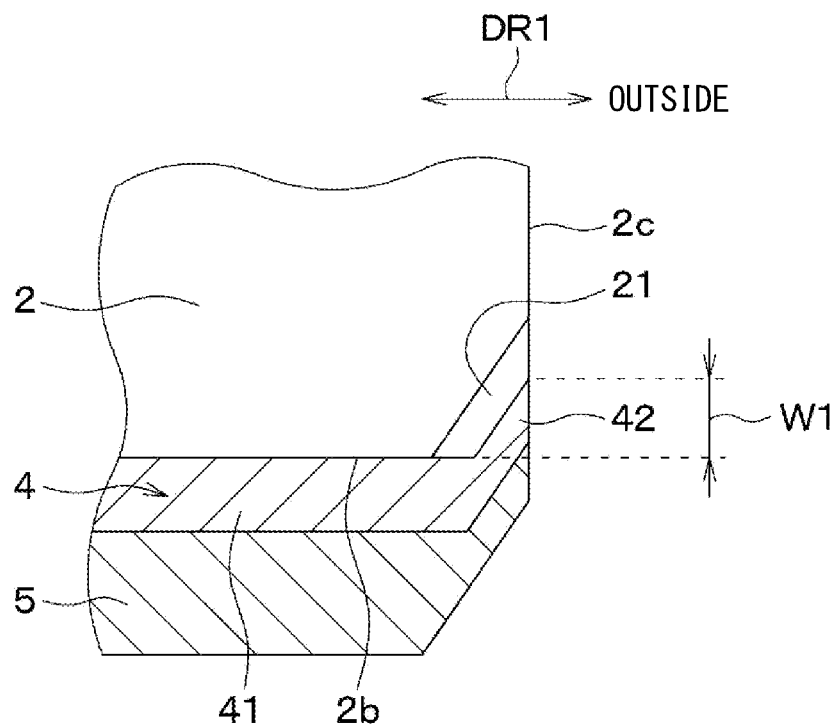
FIG. 2B is an enlarged view of a region IIB in FIG. 2A.

The silicide layer 4 is a layer including a metal silicide, which is a compound of a metal element and silicon. As shown in FIG. 2B, the silicide layer 4 includes a rear silicide layer 41 and a side silicide layer 42. The rear silicide layer 41 is a portion of the silicide layer 4 provided on the rear surface 2b of the SiC semiconductor layer 2.

The side silicide layer 42 is provided on each of the side surface 2c of the SiC semiconductor layer 2. The side silicide layer 42 covers the modified layer 21 on the side surface of the SiC semiconductor device 1. In other words, the side silicide layer 42 is adjacent to the modified layer 21 on the outside in direction DR1 parallel to the main surface 2a. The side silicide layer 42 forms a part of the side surface of the SiC semiconductor device 1. The side silicide layer 42 is arranged continuously over all of the side surfaces 2c. That is, the side silicide layers 42 are arranged in an annular shape. The side silicide layer 42 continues to the rear silicide layer 41.

In the present embodiment, the metal silicide is NiSi (nickel silicide) and includes Ni as a metal element. The entire silicide layer 4 is composed of NiSi. A width W1 of the side silicide layer 42 in the direction perpendicular to the main surface 2a is 10 μm or less. This is because a depth of the grooves 110, which will be described later, is 10 μm or less.

The rear surface electrode 5 is formed on a side close to the rear surface 2b of the SiC semiconductor layer 2. The rear surface electrode 5 is in contact with the rear silicide layer 41. The rear surface electrode 5 is composed of a conductive film.

Figure 4:
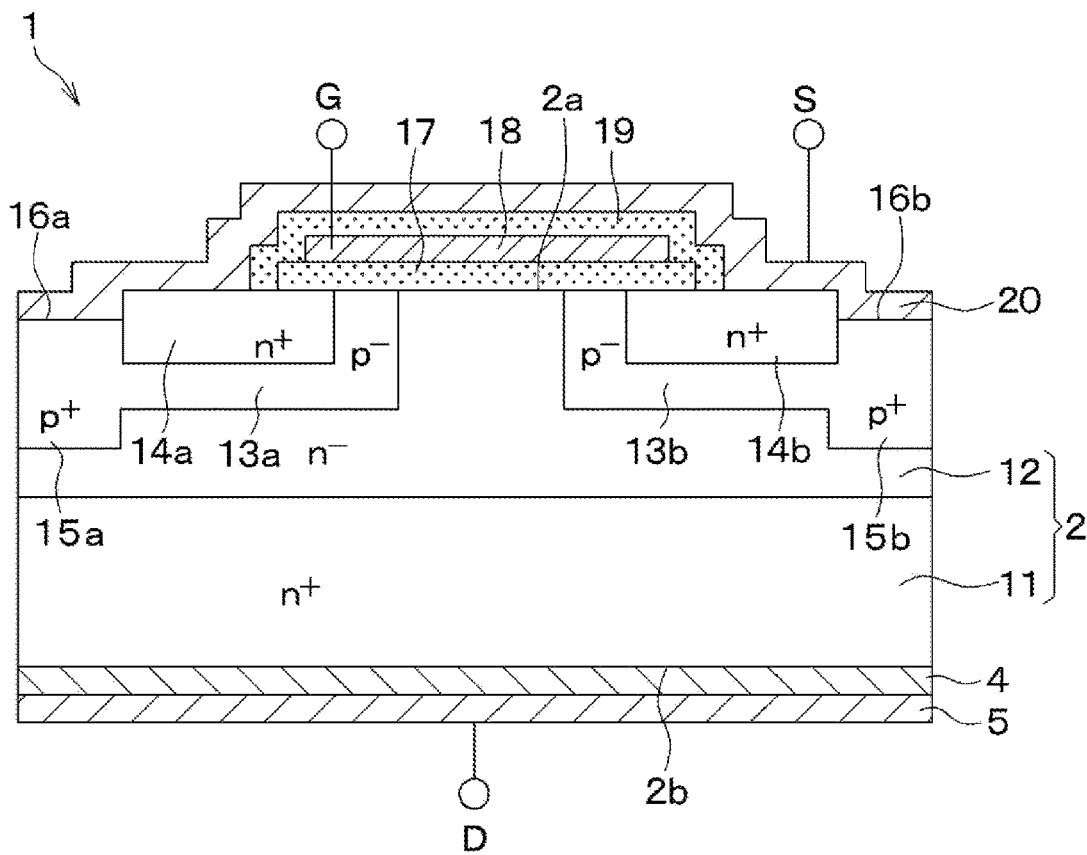
FIG. 4 is a cross-sectional view showing a specific element structure of the SiC semiconductor device according to the first embodiment.

The above is the basic configuration of the SiC semiconductor device 1. Next, the semiconductor element included in the SiC semiconductor device 1 will be described. As shown in FIG. 4, the SiC semiconductor device 1 can include a vertical power metal oxide semiconductor field effect transistor (MOSFET) as a semiconductor element.

The SiC semiconductor layer 2 has an $n^+$ type SiC substrate 11 and an $n^-$ type epitaxial layer 12. The SiC substrate 11 is composed of a single crystal of SiC. As the SiC substrate 11, a SiC substrate having an impurity concentration of $1 \times 10^{18}$ cm$^{-3}$ or higher is used. The epitaxial layer 12 is composed of SiC single crystal having a dopant concentration lower than that of the SiC substrate 11. The epitaxial layer 12 is a layer formed on a main surface of the SiC substrate 11 by epitaxial growth.

At a predetermined region in a surface portion of the epitaxial layer 12, $p^-$ type base regions 13a and 13b having a predetermined depth are formed apart from each other. The base regions 13a and 13b are provided with $p^+$ type deep base layers 15a and 15b. The $p^+$ type deep base layers 15a and 15b have a larger thickness than portions of the base regions 13a and 13b other than the $p^+$ type deep base layers 15a and 15b. The deep base layers 15a and 15b are formed at portions that do not overlap with source regions 14a and 14b, which will be described later. The $p^+$ type deep base layers 15a and 15b have a higher p type impurity concentration than the portions of the base regions 13a and 13b other than the $p^+$ type deep base layers 15a and 15b. When such deep base layers 15a, 15b are formed, electric field intensity between the SiC substrate 11 and the deep base layers 15a, 15b is increased, and avalanche breakdown is likely to be caused at these positions.

In a predetermined region in a surface layer portion of the base region 13a, an $n^+$ type source region 14a shallower than the base region 13a is formed. In a predetermined region in a surface layer portion of the base region 13b, an $n^+$ type source region 14b shallower than the base region 13b is formed. In surface portions of the base regions 13a, 13b and the source regions 14a, 14b, recessed portions 16a, 16b are formed. The deep base layers 15a, 15b are exposed at bottoms of the recessed portions 16a, 16b.

The surface portions of the base regions 13a, 13b located between the epitaxial layer 12 and the source regions 14a, 14b serve as channel regions. At least on the channel regions, a gate insulating film 17 made of, for example, a silicon oxide film is formed. The gate insulating film 17 is formed on upper surfaces of the epitaxial layer 12 and the source regions 14a, 14b as well as the channel regions. On the gate insulating film 17, a gate electrode 18 as the front surface electrode 3 is formed. The gate electrode 18 is covered with an insulating film 19 made of, for example, a silicon oxide film.

Above the main surface 2a of the SiC semiconductor layer 2, a source electrode 20 serving as the front surface electrode 3 is formed to cover the insulating film 19. The source electrode 20 is connected to the source regions 14a, 14b and the base regions 13a, 13b. Below the rear surface 2a of the SiC semiconductor layer 2, a drain electrode serving as the rear surface electrode 5 is stacked on the silicide layer 4.

[Manufacturing Method of SiC Semiconductor Device]

Next, a manufacturing method of the SiC semiconductor device 1 according to the present embodiment will be described with reference to FIGS. 5A to 5H and FIGS. 6 to 8. In the present embodiment, a scribe-and-break method is employed as a SiC wafer dicing method.

Figure 5A:
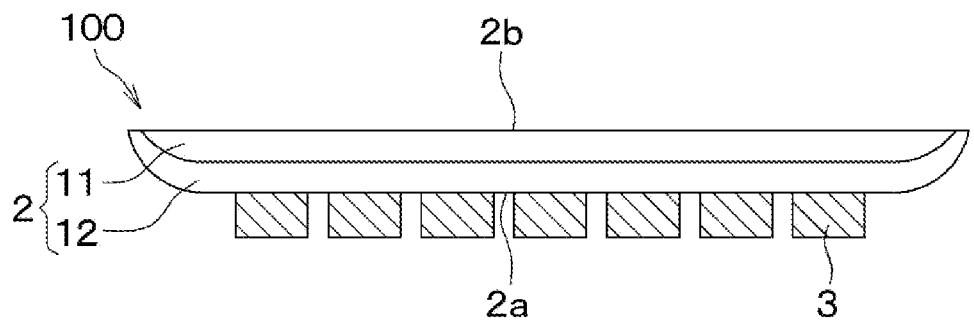
FIG. 5A is a cross-sectional view showing a manufacturing process of the SiC semiconductor device according to the first embodiment.

First, as shown in FIG. 5A, a SiC wafer 100 is prepared, and a part of a rear surface of the SiC wafer 100 is removed. The SiC wafer 100 to be prepared includes the SiC semiconductor layer 2 having the main surface 2a and the rear surface 2b. The SiC semiconductor layer 2 includes the SiC substrate 11 and the epitaxial layer 12. A surface layer of the SiC semiconductor layer 2 includes a semiconductor region, which is not shown. The semiconductor region includes the base regions 13a, 13b, the source regions 14a, 14b, and the like, which are shown in FIG. 4. The SiC wafer 100 to be prepared has the front surface electrode 3 formed on the main surface 2a of the SiC semiconductor layer 2. The rear surface of the SiC wafer 100, that is, a portion adjacent to the rear surface 2b of the SiC semiconductor layer 2 is ground.

Figure 5B:
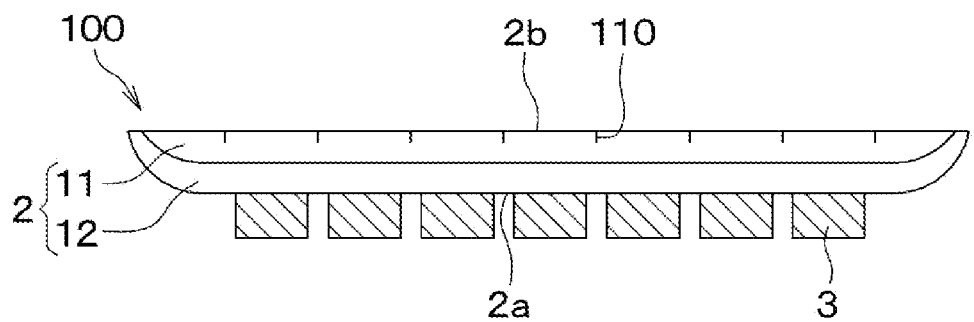
FIG. 5B is a cross-sectional view showing a manufacturing process of the SiC semiconductor device following to the process shown in FIG. 5A.
Figure 6:
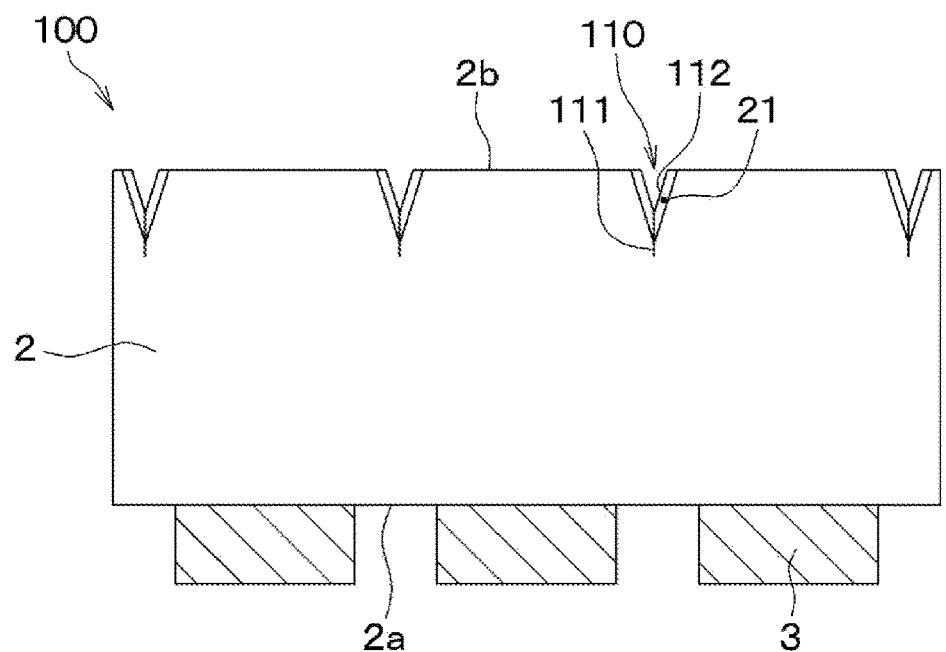
FIG. 6 is an enlarged view of a portion of a SiC wafer in FIG. 5B.

Subsequently, as shown in FIG. 5B, grooves 110 are formed in the rear surface 2b of the SiC semiconductor layer 2, and cracks 111 are generated as shown in FIG. 6. This is a scribing process. The grooves 110 are formed along lines to be cut using a scribe tool such as a pen, roller, laser, or the like. The cracks 111 extend from the bottoms of the grooves 110 in a thickness direction of the SiC semiconductor layer 2. The thickness direction is a direction orthogonal to the main surface 2a and the rear surface 2b. The grooves 110 are formed by wall surfaces 112. The wall surfaces 112 form a part of the side surface 2c of the SiC semiconductor layer 2 after dicing.

At this time, since the grooves 110 are formed in the rear surface 2b of the SiC semiconductor layer 2, a crystal structure of peripheral portions of the SiC semiconductor layer 2 around the grooves 110 is disturbed. As a result, the peripheral portions around the grooves 110 become the modified layers 21. The peripheral portions of the grooves 110 are regions of the SiC semiconductor layer 2 adjacent to the wall surfaces 112 and include the wall surface 112. In other words, the peripheral portions of the grooves 110 are regions of the SiC semiconductor layer 2 where the wall surfaces 112 are formed.

Figure 5C:
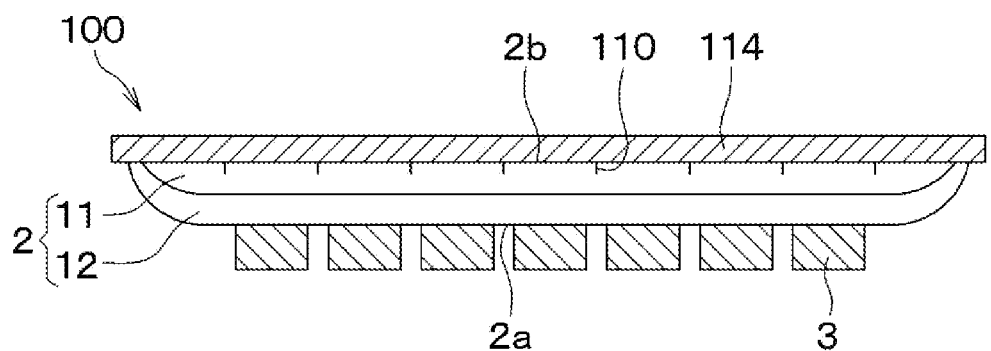
FIG. 5C is a cross-sectional view showing a manufacturing process of the SiC semiconductor device following to the process shown in FIG. 5B.
Figure 7:
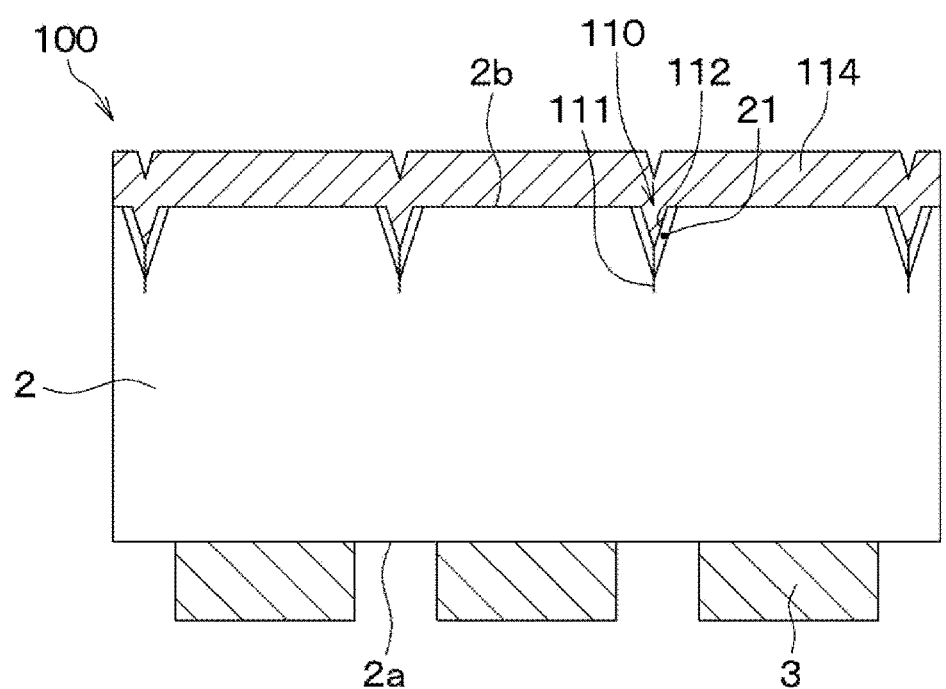
FIG. 7 is an enlarged view of a portion of the SiC wafer in FIG. 5O.

Subsequently, as shown in FIGS. 5C and 7, a metal film 114 is formed over the rear surface 2b of the SiC semiconductor layer 2 and the wall surfaces 112 forming the grooves 110. The metal film 114 is in contact with rear surface 2b and the wall surfaces 112. The metal film 114 is a Ni film made of Ni.

Figure 5D:
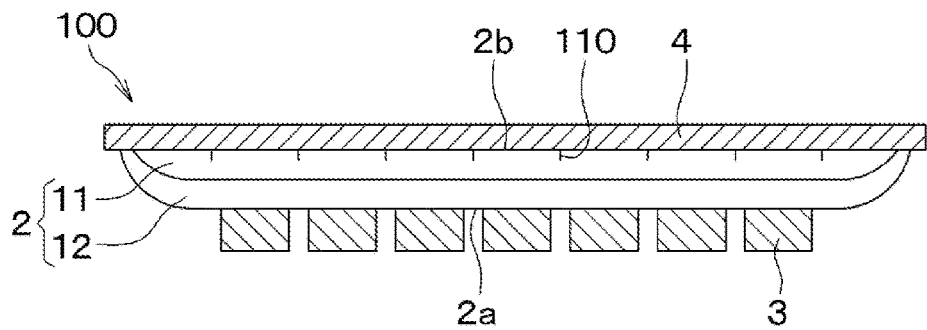
FIG. 5D is a cross-sectional view showing a manufacturing process of the SiC semiconductor device following to the process shown in FIG. 5C.
Figure 8:
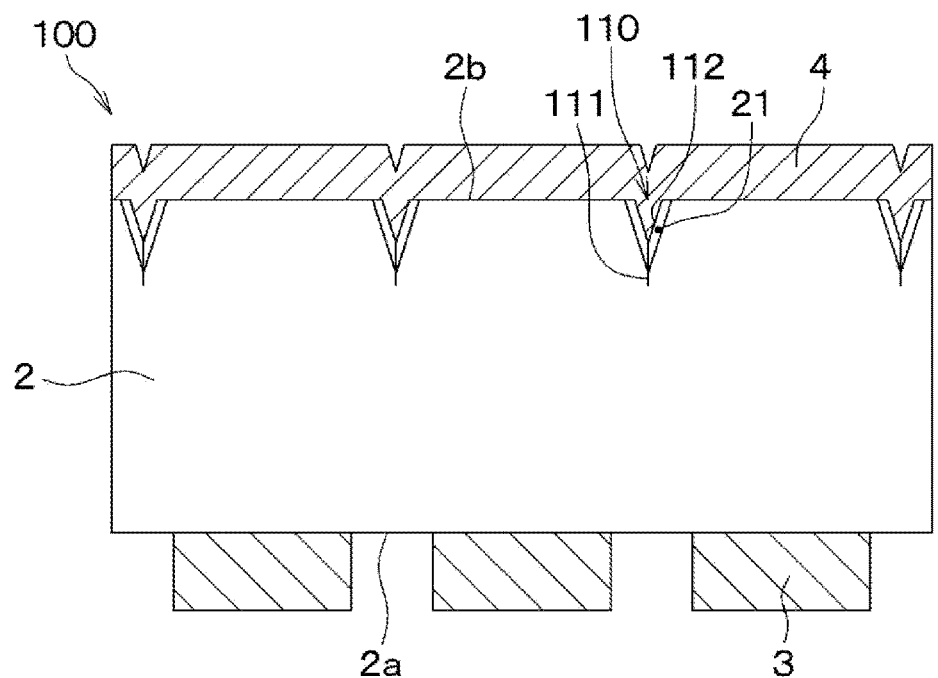
FIG. 8 is an enlarged view of a portion of the SiC wafer in FIG. 5D.

Subsequently, as shown in FIGS. 5D and 8, silicon contained in the SiC semiconductor layer 2 and a metal element contained in the metal film 114 are reacted by a heat treatment to the rear surface 2b of the SiC semiconductor layer 2 to form the silicide layer 4. This reaction is a silicide reaction. As a method of the heat treatment, a laser annealing is employed. The silicide layer 4 is formed over the rear surface 2b and the wall surfaces 112. The silicide layer 4 includes NiSi as a metal silicide.

A portion of the silicide layer 4 disposed on the rear surface 2b is the rear silicide layer 41 shown in FIG. 2B. A portion of the silicide layer 4 disposed on the wall surface 112 is the side silicide layer 42 shown in FIG. 2B. In this manner, the side silicide layer 42 is formed using the process of forming the silicide layer 4 on the rear surface 2b of the SiC wafer 100 by laser annealing.

Figure 5E:
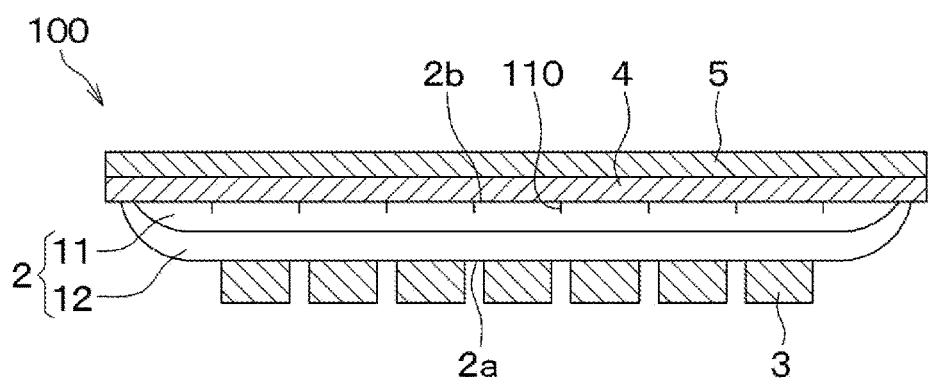
FIG. 5E is a cross-sectional view showing a manufacturing process of the SiC semiconductor device following to the process shown in FIG. 5D.

Subsequently, as shown in FIG. 5E, a metal film is formed on the rear surface 2b of the SiC semiconductor layer 2 to form the rear surface electrode 5. At this time, a laminated film of Ti, Ni, and Au is formed as the metal film.

Figure 5F:
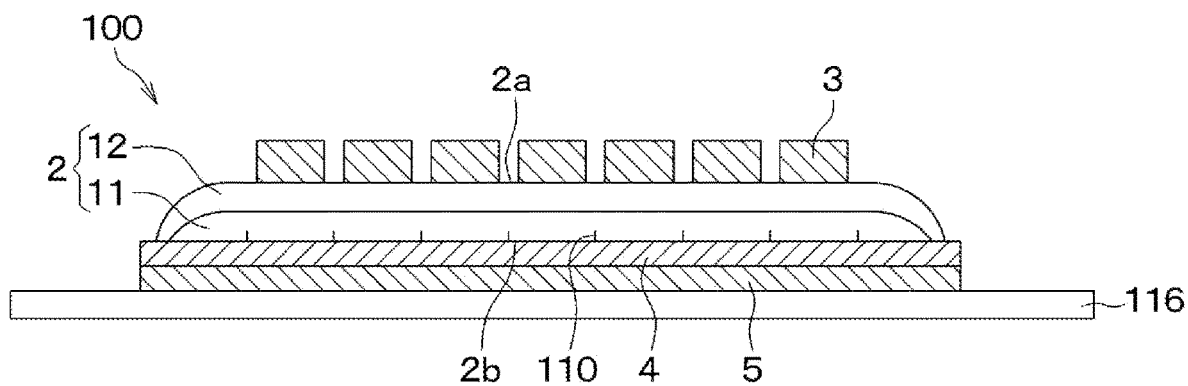
FIG. 5F is a cross-sectional view showing a manufacturing process of the SiC semiconductor device following to the process shown in FIG. 5E.

Subsequently, as shown in FIG. 5F, a dicing tape 116 is attached to a side close to the rear surface 2b of the SiC semiconductor layer 2.

Figure 5G:
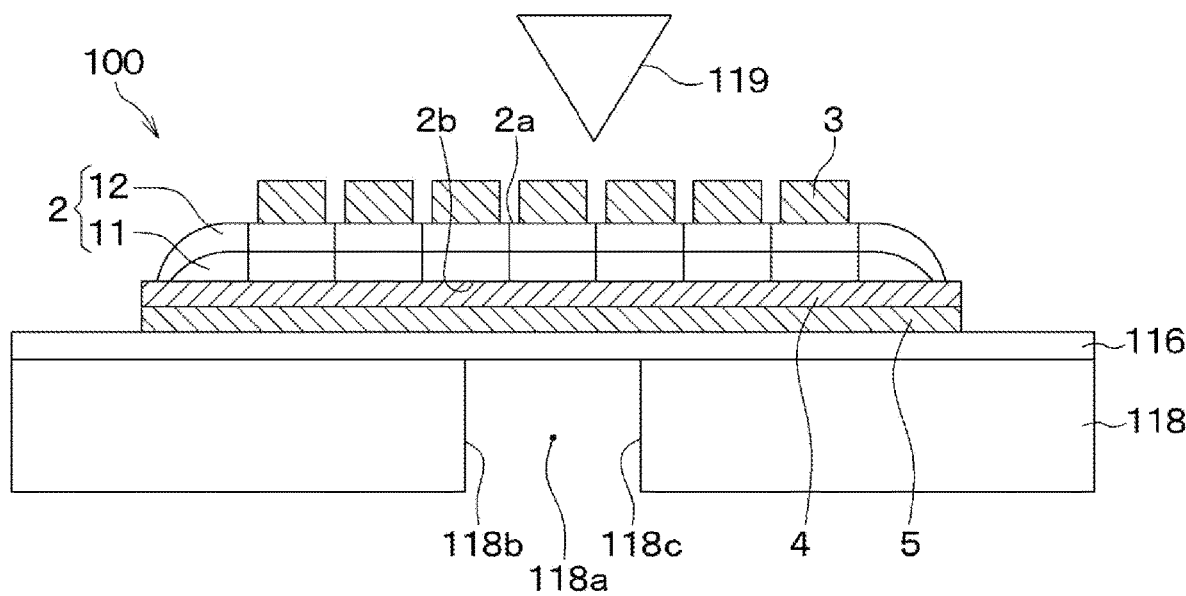
FIG. 5G is a cross-sectional view showing a manufacturing process of the SiC semiconductor device following to the process shown in FIG. 5F.

Subsequently, as shown in FIG. 5G, a breaking device is used to apply stress to the SiC wafer 100 to cut the SiC wafer 100 into multiple chips. This is a breaking process.

The breaking device includes a support table 118 that supports the SiC wafer 100 and a blade 119 that applies stress to the SiC wafer 100. The support table 118 has a space portion 118a. The SiC wafer 100 is placed on the support table 118. In this state, the blade 119 applies stress to the main surface 2a of the SiC wafer 100. Accordingly, the SiC wafer 100 is subjected to three-point bending by the blade 119 and the walls 118b and 118c defining the space portion 18a of the support table 118.

Figure 9:
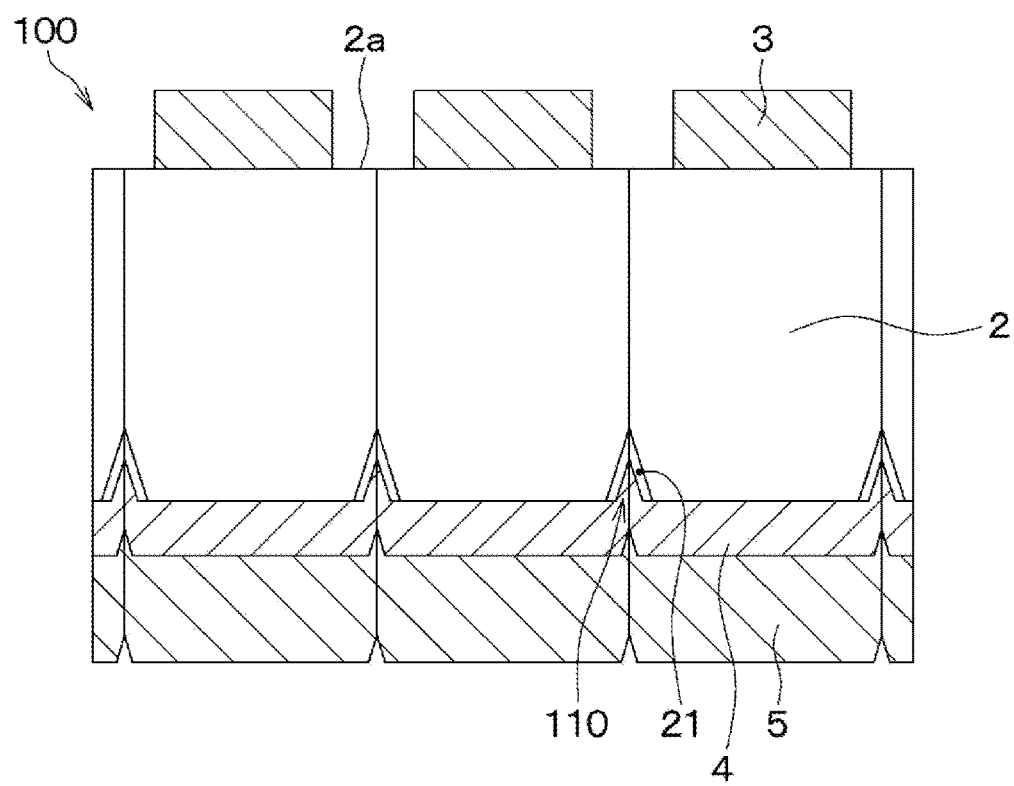
FIG. 9 is an enlarged view of a portion of the SiC wafer in FIG. 5G.

In the breaking process, this three-point bending causes the cracks 111 shown in FIG. 8 to propagate along the direction perpendicular to the main surface 2a. As a result, as shown in FIG. 9, the SiC semiconductor layer 2 of the SiC wafer 100 is cleaved. The silicide layer 4 and the rear surface electrode 5 are also cleaved starting from the grooves formed therein. Accordingly, the SiC wafer 100 is cut into multiple chips.

Figure 5H:
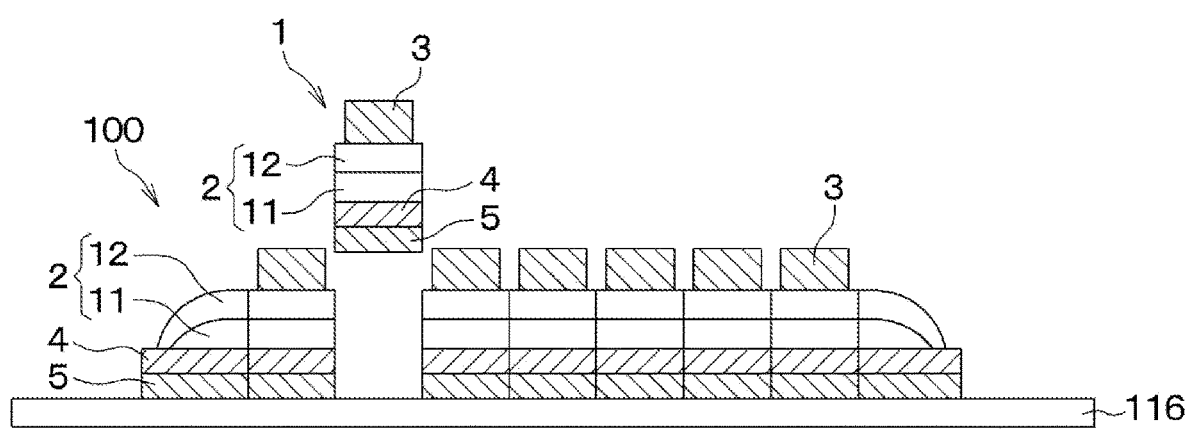
FIG. 5H is a cross-sectional view showing a manufacturing process of the SiC semiconductor device following to the process shown in FIG. 5G.

Subsequently, as shown in FIG. 5H, the dicing tape 116 is irradiated with UV and die-picked. That is, each cut chip is taken out. As described above, the SiC semiconductor device according to the present embodiment is manufactured.

Next, the effects of the present embodiment will be described in comparison with Comparative Example 1. In a method of manufacturing a SiC semiconductor device of Comparative Example 1, processes shown in FIGS. 10A to 10H are performed.

Figure 10A:
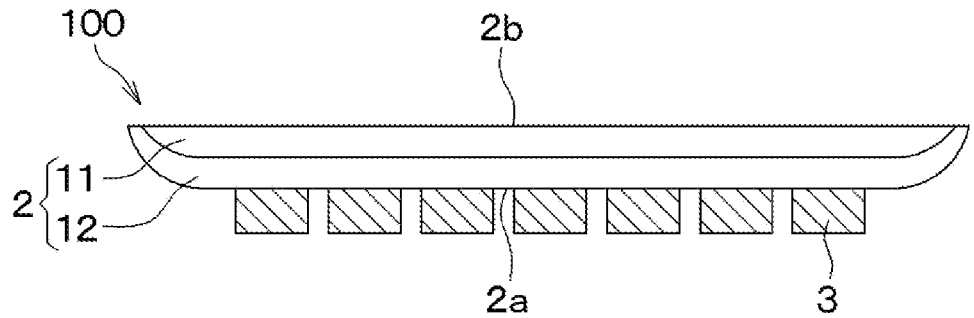
FIG. 10A is a cross-sectional view showing a manufacturing process of a SiC semiconductor device according to Comparative Example 1.
Figure 10B:
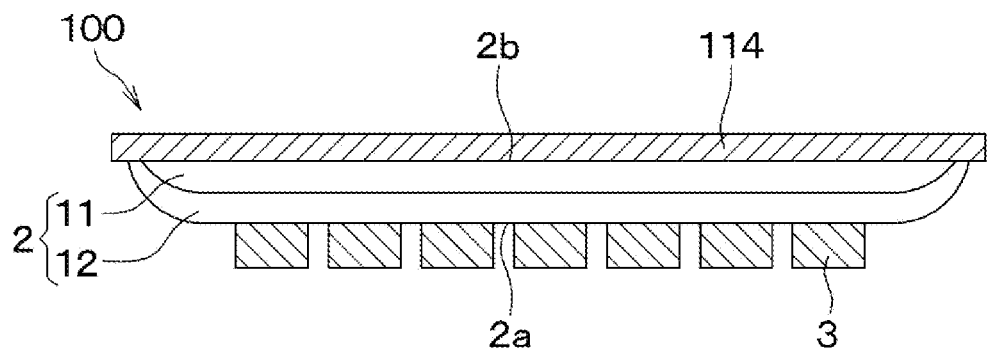
FIG. 10B is a cross-sectional view showing a manufacturing process of the SiC semiconductor device following to the process shown in FIG. 10A.
Figure 10C:
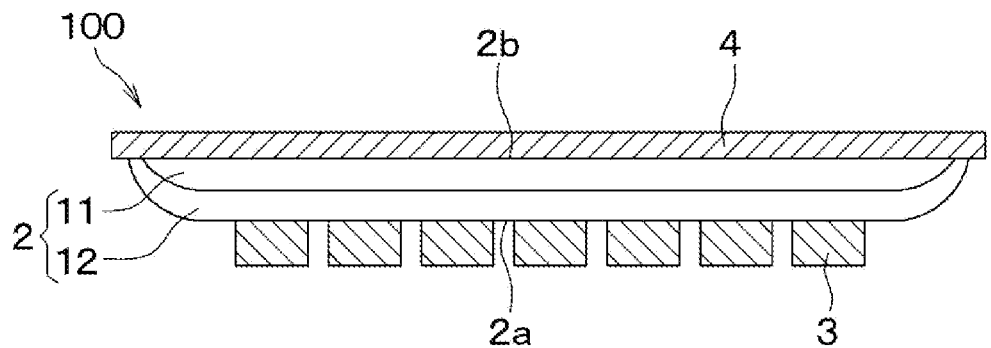
FIG. 10O is a cross-sectional view showing a manufacturing process of the SiC semiconductor device following to the process shown in FIG. 1013.
FIG. 10D is a cross-sectional view showing a manufacturing process of the SiC semiconductor device following to the process shown in FIG. 10O.
FIG. 10E is a cross-sectional view showing a manufacturing process of the SiC semiconductor device following to the process shown in FIG. 10D.
FIG. 10F is a cross-sectional view showing a manufacturing process of the SiC semiconductor device following to the process shown in FIG. 10E.
FIG. 10G is a cross-sectional view showing a manufacturing process of the SiC semiconductor device following to the process shown in FIG. 10F.
FIG. 10H is a cross-sectional view showing a manufacturing process of the SiC semiconductor device following to the process shown in FIG. 10G.
Figure 10D:
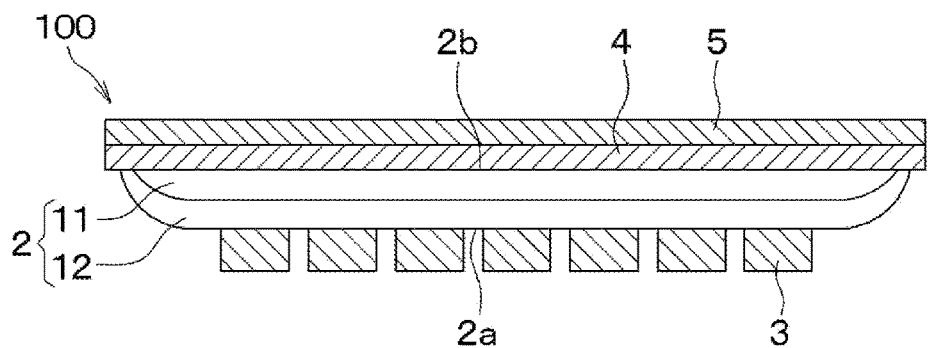

In the process shown in FIG. 10A, a portion of a rear side of a SiC wafer 100 is removed in a manner similar to the process shown in FIG. 5A. Subsequently, in the process shown in FIG. 10B, a metal film 114 is formed on a rear surface 2b of a SiC semiconductor layer 2. Subsequently, in the process shown in FIG. 10C, a silicide layer 4 is formed on the rear surface 2b by heat-treating a side close to the rear surface 2b of the SiC semiconductor layer 2. Subsequently, in the process shown in FIG. 10D, a rear surface electrode 5 is formed on the side close to the rear surface 2b of the SiC semiconductor layer 2.

Figure 10E:
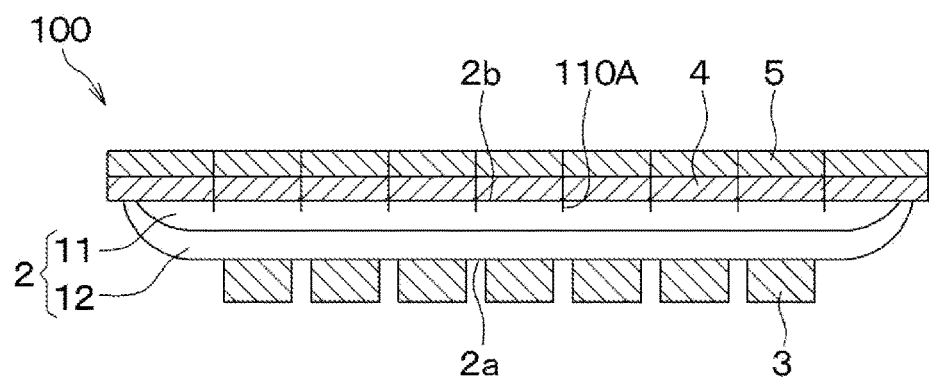

Subsequently, in the process shown in FIG. 10E, grooves 110A are formed to the rear surface 2b of the SiC semiconductor layer 2. The grooves 110A are formed with a depth that reaches a portion of SiC semiconductor layer 2 through the rear surface electrode 5 and the silicide layer 4. Although not shown, cracks extending in the thickness direction of SiC semiconductor layer 2 are formed from the bottoms of the grooves 110A by forming the grooves 100A. Furthermore, although not shown, peripheries of the grooves 110A become modified layers by forming the grooves 110A.

Figure 10F:
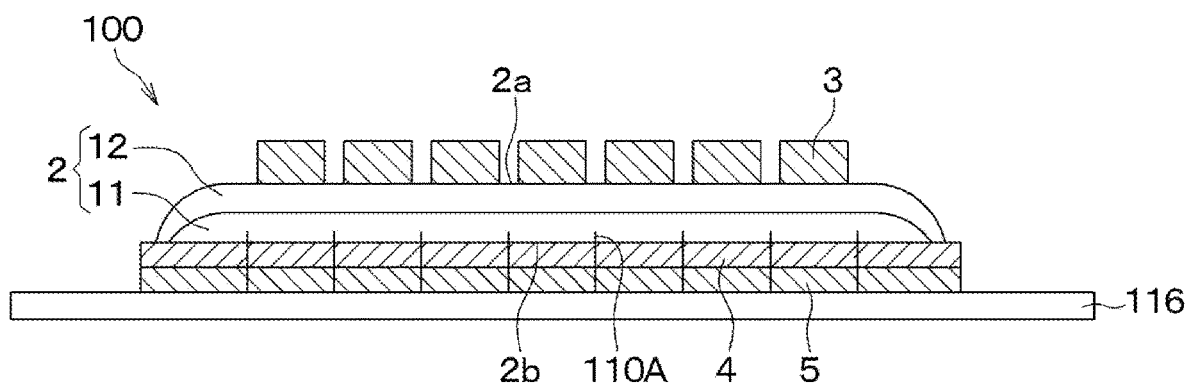
Figure 10G:
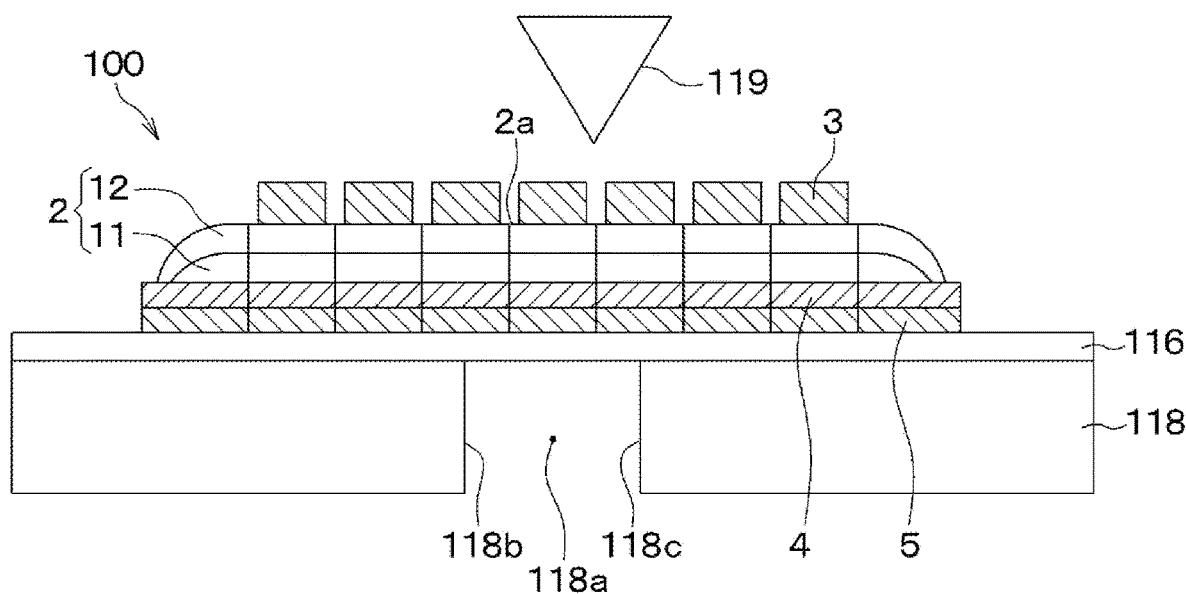
Figure 10H:
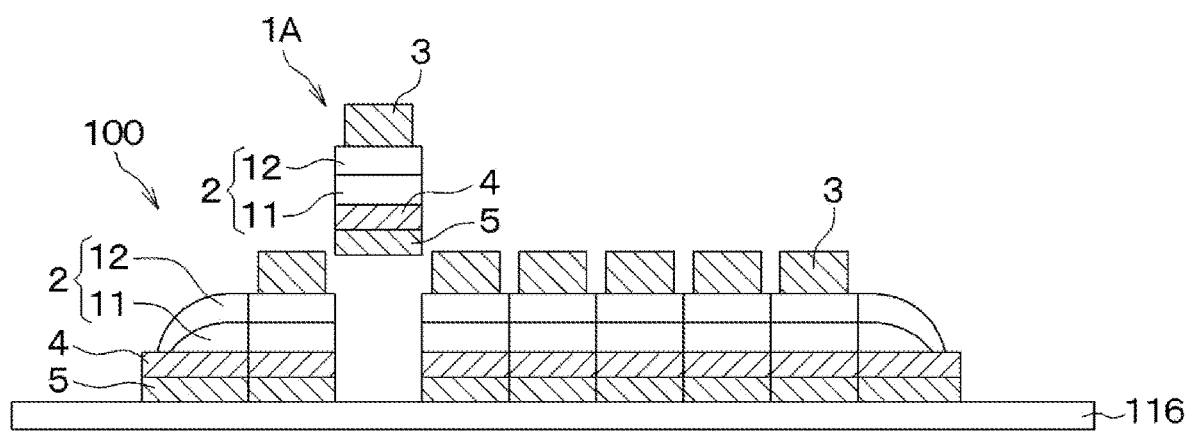

Subsequently, in the process shown in FIG. 10F, a dicing tape 116 is attached to the side close to the rear surface 2b of the SiC semiconductor layer 2. Subsequently, in the process shown in FIG. 10G, a breaking device is used to apply stress to the SiC wafer 100 to cut the SiC wafer 100 into multiple chips. Subsequently, in the process shown in FIG. 10H, the dicing tape 116 is irradiated with UV and die-picked. The SiC semiconductor device 1A of Comparative Example 1 is manufactured as described above.

Figure 11:
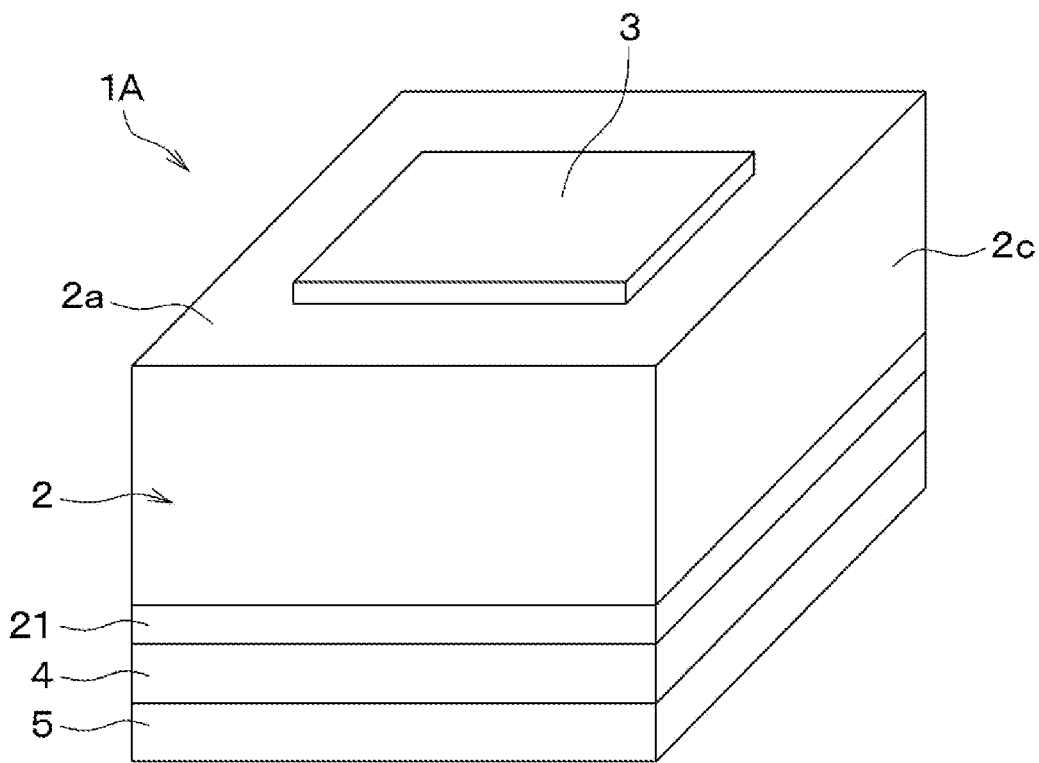
FIG. 11 is a perspective view of the SiC semiconductor device according to Comparative Example 1.
Figure 12:
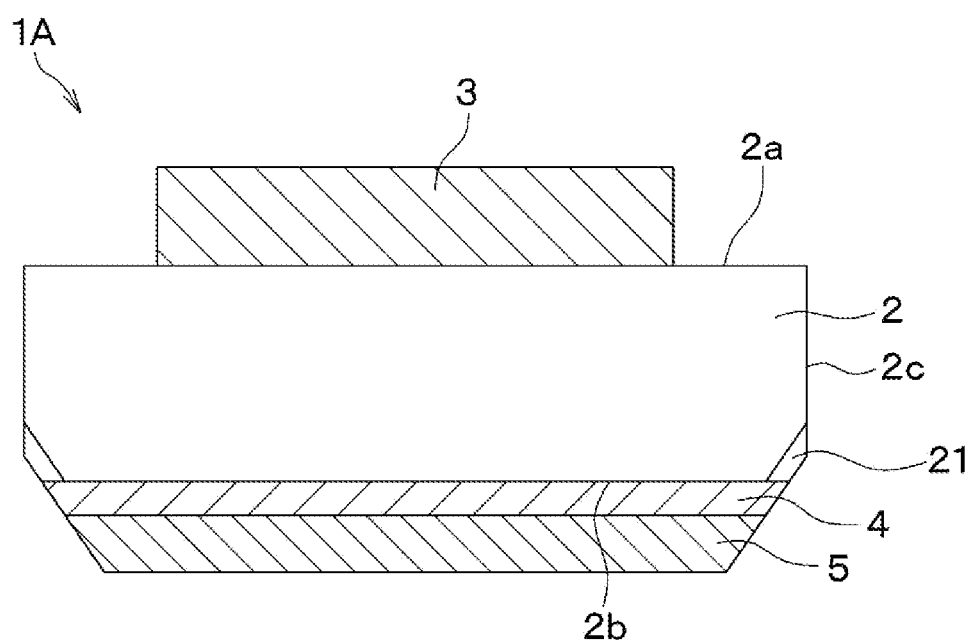
FIG. 12 is a cross-sectional view of the SiC semiconductor device according to Comparative Example 1.
Figure 13:
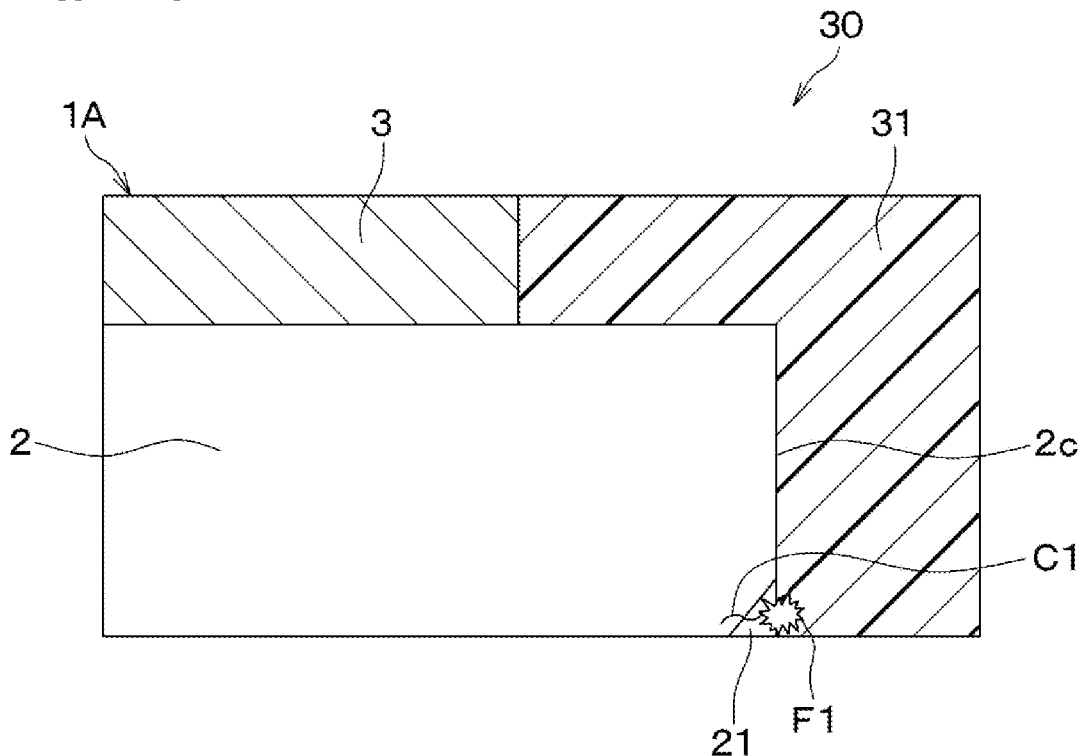
FIG. 13 is a cross-sectional view of part of a power card in which the SiC semiconductor device according to Comparative Example 1 is mounted.

As shown in FIG. 11 and FIG. 12, in the SiC semiconductor device 1A of Comparative Example 1, the modified layer 21 is exposed on a portion of the side surface 2c of the SiC semiconductor layer 2 located close to the rear surface 2b. Therefore, as shown in FIG. 13, in a power card 30 in which the SiC semiconductor device 1A is mounted, when a thermal stress F1 is applied to the SiC semiconductor device 1A, a crack C1 occurs in the modified layer 21 exposed at the side surface 2c of the SiC semiconductor layer 2. The present inventors have found the issue that the crack C1 progresses into the SiC semiconductor layer 2. In FIG. 13, the SiC semiconductor device 1A is sealed with a resin member 31.

On the other hand, the manufacturing method of the SiC semiconductor device 1 of the present embodiment includes preparing the SiC wafer 100 including SiC semiconductor layer 2 having the main surface 2a and the rear surface 2b, forming the grooves 110 on the rear surface 2b to generate the cracks 111, forming the metal film 114 on the wall surface 112 forming the grooves 110, forming the side silicide layer 42 in the portion of the SiC semiconductor layer 2 close to the wall surface 112 by heat treatment, and applying stress to the SiC wafer 100 to cut the SiC wafer 100 into multiple chips.

Accordingly, the SiC semiconductor device 1 of the present embodiment can be manufactured. The SiC semiconductor device 1 includes the SiC semiconductor layer 2 including the SiC single crystal. The SiC semiconductor layer 2 has the main surface 2a, the rear surface 2b, and the side surface 2c. The SiC semiconductor layer 2 includes the modified layer 21 forming a part of the side surface 2b located close to the rear surface 2b. The SiC semiconductor device 1 further includes the side silicide layer 42 disposed on the side surface 2c of the SiC semiconductor layer 2 and covering the modified layer 21.

According to the above configuration, the side silicide layer 42 covers the modified layer 21 on the side surface 2c of the SiC semiconductor layer 2. Therefore, when the SiC semiconductor device 1 mounted on the power card 30 is subjected to the thermal stress F1, a stress applied to the modified layer 21 is relaxed as compared with the SiC semiconductor device 1A of Comparative Example 1 without the side silicide layer 42. Therefore, as compared with the SiC semiconductor device 1A of Comparative Example 1, generation of cracks on the side surface 2c of the SiC semiconductor layer 2 can be suppressed.

Similar effects can be obtained not only when the SiC semiconductor device 1 is mounted on the power card 30, but also when the SiC semiconductor device 1 is mounted on another device. That is, when stress is applied to SiC semiconductor device 1, stress applied to modified layer 21 can be relaxed.

Second Embodiment

In the first embodiment, the side silicide layer 42 is adjacent to the modified layer 21 on the outside in the direction DR1 parallel to the main surface 2a.

Figure 14:
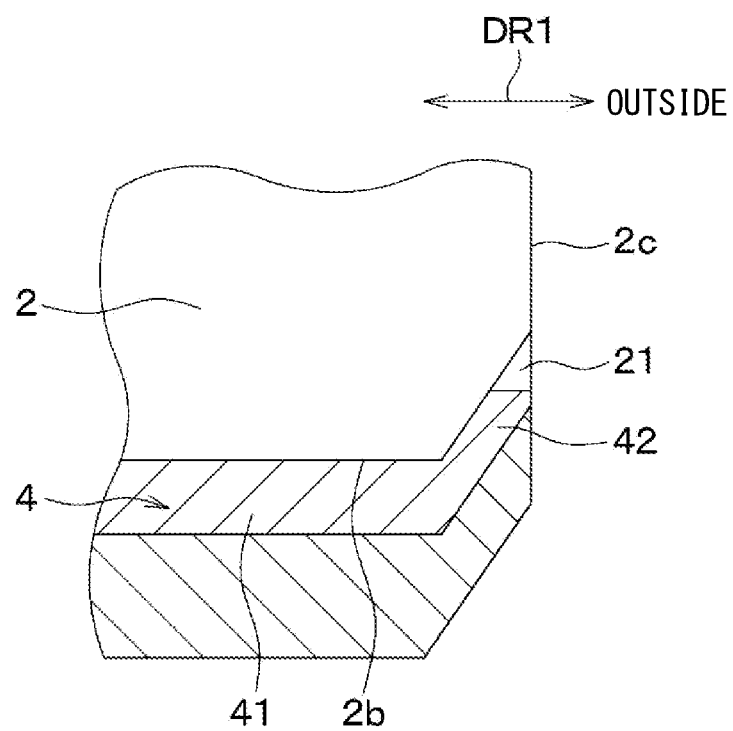
FIG. 14 is a cross-sectional view enlarging a part of a SiC semiconductor device according to a second embodiment.

On the other hand, in the present embodiment, as shown in FIG. 14, the side silicide layer 42 extends in the direction DR1 parallel to the main surface 2a and faces and is in contact with a portion of the SiC semiconductor layer 2 made of a SiC single crystal. That is, the modified layer 21 is not present between the portion of SiC semiconductor layer 2 made of SiC single crystal and the side silicide layer 42 extending in the direction DR1 parallel to the main surface 2a.

Also in the present embodiment, the side silicide layer 42 forms a part of the side surface of the SiC semiconductor device 1. The side silicide layer 42 is adjacent to the modified layer 21 exposed on the side surface 2c of the SiC semiconductor layer 2 on a side close to the rear surface 2b of the SiC semiconductor layer 2.

The above structure is formed because the silicide reaction of the portion of the modified layer 21 shown in FIG. 7 that is in contact with the metal film 114 mainly occur in the direction DR1 parallel to the main surface 2a when the silicide layer 4 is formed in the process shown in FIG. 5D and FIG. 8, which has been described in the first embodiment. Even in this case, no silicide reaction occurs in the portion of the modified layer 21 shown in FIG. 7 that is not in contact with the metal film 114. Therefore, as shown in FIG. 14, a part of the modified layer 21 generated in the scribing process remains.

Other configurations of the SiC semiconductor device 1 and other configurations of the manufacturing method of the SiC semiconductor device 1 are the same as those of the first embodiment.

According to the present embodiment, since the side silicide layer 42 is formed on the side surface 2c of the SiC semiconductor layer 2, the modified layer 21 is reduced compared with the SiC semiconductor device 1A of Comparative Example 1 without the side silicide layer 42. Accordingly, compared with the SiC semiconductor device 1A of Comparative Example 1, the generation of cracks on the side surface 2c of the SiC semiconductor layer 2 can be suppressed.

OTHER EMBODIMENTS

In the SiC semiconductor device 1 of the first embodiment, the silicide layers 4 including the rear silicide layer 41 and the side silicide layer 42 are composed only of NiSi as a metal silicide. However, the silicide layer 4 may contain compounds other than metal silicides. Compounds other than metal silicides include metal carbides such as MoC and TiC.

The silicide layer 4 may contain metal silicides other than NiSi. Metal silicides other than NiSi include TiSi, MoSi, TaSi, PtSi, CoSi, and the like. The metal silicides may contain multiple metal elements. As described above, the metal silicide contained in the silicide layer 4 should contain at least one of Ni, Ti, Mo, Ta, Pt, and Co as a metal element.

Figure 15:
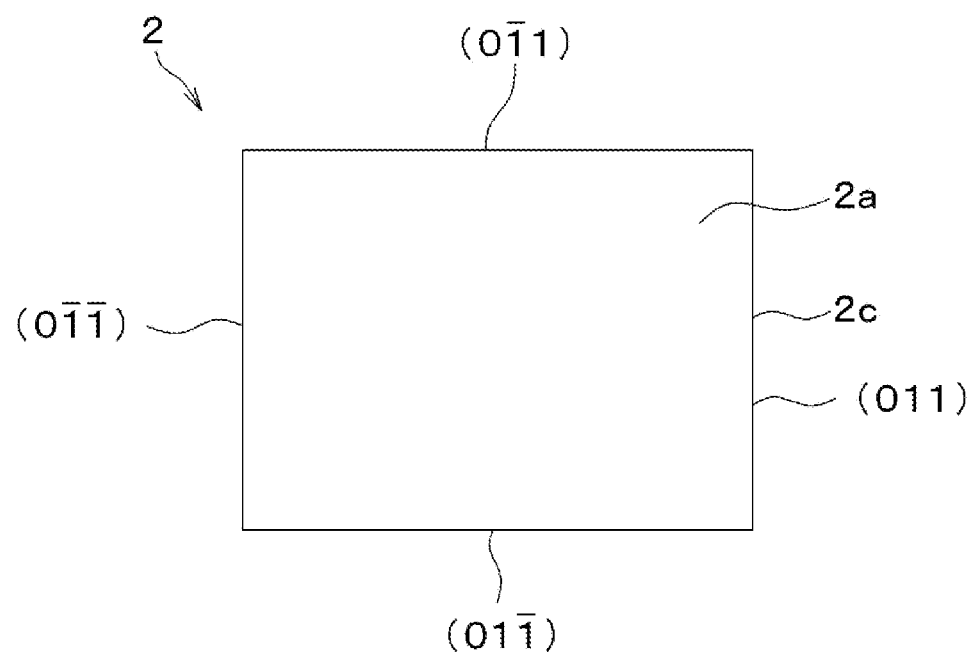
FIG. 15 is a top view of a SiC semiconductor layer included in a SiC semiconductor device according to another embodiment.

In the SiC semiconductor device 1 of the first embodiment, the SiC semiconductor layer 2 is a hexagonal SiC single crystal. However, the SiC semiconductor layer 2 may be a cubic SiC single crystal. In this case, the crystal orientation plane of the cleavage planes forming the multiple side surfaces 2c is a (011) plane, as shown in FIG. 15. A (0-1-1) plane, a (011) plane, a (01-1) plane, and a (0-11) plane all have the same structure.

In the manufacturing method of the SiC semiconductor device 1 of the first embodiment, forming the side silicide layer 42 and forming the rear silicide layer 41 are performed simultaneously. Therefore, the side silicide layer 42 continues to the rear silicide layer 41. However, forming the side silicide layer 42 and forming the rear silicide layer 41 may be performed separately. In this case, the side silicide layer 42 may be separated from the rear silicide layer 41.

In the SiC semiconductor device 1 of the first embodiment, the side silicide layer 42 is arranged continuously over all of the multiple side surfaces 2c. However, the side silicide layers 42 do not have to be arranged continuously. The side silicide layer 42 may be arranged only on some of the four side surfaces 2c. Even in these cases, the occurrence of cracks on the side surface 2c of the SiC semiconductor layer 2 can be suppressed in the portion where the side silicide layer 42 is formed.

The semiconductor element included in the SiC semiconductor device 1 of the first embodiment is a planar vertical power MOSFET. However, the semiconductor device may be a wrench-gate vertical power MOSFET. The semiconductor element may be another vertical semiconductor element.

The present disclosure is not limited to the foregoing description of the embodiments and can be modified within the scope of the present disclosure. The present disclosure may also be varied in many ways. Such variations are not to be regarded as departure from the disclosure, and all such modifications are intended to be included within the scope of the disclosure. The above-described embodiments are not independent of each other, and can be appropriately combined except when the combination is obviously impossible. In each of the above-described embodiments, individual elements or features of a particular embodiment are not necessarily essential unless it is specifically stated that the elements or the features are essential, or unless the elements or the features are obviously essential in principle. Further, in each of the above-described embodiments, when numerical values such as the number, quantity, range, and the like of the constituent elements of the embodiment are referred to, except in the case where the numerical values are expressly indispensable in particular, the case where the numerical values are obviously limited to a specific number in principle, and the like, the present disclosure is not limited to the specific number. Furthermore, a material, a shape, a positional relationship, or the like, if specified in the above-described example embodiments, is not necessarily limited to the specific material, shape, positional relationship, or the like unless it is specifically stated that the material, shape, positional relationship, or the like is necessarily the specific material, shape, positional relationship, or the like, or unless the material, shape, positional relationship, or the like is obviously necessary to be the specific material, shape, positional relationship, or the like in principle.

What is claimed is:

1. A silicon carbide semiconductor device comprising:
a silicon carbide semiconductor layer including a silicon carbide single crystal and having a main surface, a rear surface opposite to the main surface, and a side surface connecting the main surface and the rear surface and formed by a cleavage plane, the silicon carbide semiconductor layer further including a modified layer, the modified layer forming a part of the side surface located close to the rear surface and having an atomic arrangement structure of silicon carbide different from an atomic arrangement structure of the silicon carbide single crystal; and
a side silicide layer including a metal silicide that is a compound of a metal element and silicon, the side silicide layer disposed on the side surface of the silicon carbide semiconductor layer and covering the modified layer.

2. The silicon carbide semiconductor device according to claim 1, further comprising
a rear silicide layer disposed on the rear surface of the silicon carbide semiconductor layer and including a metal silicide that is a compound of a metal element and silicon, wherein
the side silicide layer continues to the rear silicide layer.

3. The silicon carbide semiconductor device according to claim 1, wherein
the metal silicide includes at least one element selected from a group consisting of Ni, Ti, Mo, Ta, Pt and Co as the metal element.

4. The silicon carbide semiconductor device according to claim 1, wherein
the side surface of the silicon carbide semiconductor layer includes a plurality of side surfaces,
the modified layer forms a part of each of the plurality of side surfaces close to the rear surface, and
the side silicide layer is arranged continuously over all of the plurality of side surfaces.

5. A silicon carbide semiconductor device comprising:
a silicon carbide semiconductor layer including a portion made of a silicon carbide single crystal and having a main surface, a rear surface opposite to the main surface, and a side surface connecting the main surface and the rear surface and formed by a cleavage plane, the silicon carbide semiconductor layer further including a modified layer, the modified layer forming a part of the side surface located close to the rear surface and having an atomic arrangement structure of silicon carbide different from an atomic arrangement structure of the silicon carbide single crystal; and
a side silicide layer including a metal silicide that is a compound of a metal element and silicon, the side silicide layer disposed on the side surface of the silicon carbide semiconductor layer, being adjacent to a side of the modified layer that is close to the rear surface, and facing and being in contact with the portion of the silicon carbide semiconductor layer made of the silicon carbide single crystal in a direction parallel to the main surface.

6. The silicon carbide semiconductor device according to claim 5, further comprising
a rear silicide layer disposed on the rear surface of the silicon carbide semiconductor layer and including a metal silicide that is a compound of a metal element and silicon, wherein
the side silicide layer continues to the rear silicide layer.

7. The silicon carbide semiconductor device according to claim 5, wherein
the metal silicide includes at least one element selected from a group consisting of Ni, Ti, Mo, Ta, Pt and Co as the metal element.

8. The silicon carbide semiconductor device according to claim 5, wherein
the side surface of the silicon carbide semiconductor layer includes a plurality of side surfaces,
the modified layer forms a part of each of the plurality of side surfaces close to the rear surface, and
the side silicide layer is arranged continuously over all of the plurality of side surfaces.

9. A manufacturing method of a silicon carbide semiconductor device, comprising:
preparing a silicon carbide wafer including a silicon carbide semiconductor layer, the silicon carbide semiconductor layer including a silicon carbide single crystal and having a main surface and a rear surface opposite to the main surface;
forming a groove on the rear surface of the silicon carbide semiconductor layer along a line to be cut to generate a crack;
forming a metal film on a wall surface that forms the groove;
forming a silicide layer including a metal silicide on a portion of the silicon carbide semiconductor layer close to the wall surface by reacting silicon contained in the silicon carbide semiconductor layer with a metal element contained in the metal film by heat treatment; and
applying stress to the silicon carbide wafer to propagate the crack along a direction orthogonal to the main surface, and cutting the silicon carbide wafer into a plurality of chips.

10. The manufacturing method according to claim 9, wherein
the forming the metal film includes forming the metal film over the rear surface of the silicon carbide semiconductor layer and the wall surface, and
the forming the silicide layer includes forming the silicide layer over the rear surface of the silicon carbide semiconductor layer and the wall surface.

* * * * *